United States Patent [19]
Mintz

[11] 4,142,251
[45] Feb. 27, 1979

[54] FIELD PROGRAMMABLE READ-ONLY-MEMORY
[75] Inventor: S. Stanley Mintz, Corvallis, Oreg.
[73] Assignee: Hewlett-Packard Company, Palo Alto, Calif.
[21] Appl. No.: 853,681
[22] Filed: Nov. 21, 1977
[51] Int. Cl.$^2$ .............................................. G11C 11/40
[52] U.S. Cl. ................................... 365/181; 307/205; 307/238; 365/176; 365/185
[58] Field of Search ...................... 307/205, 238, 288; 365/181, 184, 185, 174, 176

[56] References Cited
U.S. PATENT DOCUMENTS

| 3,864,558 | 2/1975 | Yu .......................................... 307/288 |
| 3,968,479 | 7/1976 | Goser ..................................... 365/181 |
| 3,990,056 | 11/1976 | Luisi et al. ............................ 365/181 |

OTHER PUBLICATIONS
Spampinato et al., High-Speed Complementary Memory Cell, IBM Technical Disclosure Bulletin, vol. 14, No. 6, 11/71, pp. 1723-1725.

*Primary Examiner*—Stuart N. Hecker
*Attorney, Agent, or Firm*—David A. Boone

[57] ABSTRACT

A P-channel and an N-channel MOS device share a common floating gate. Avalanche injection of electrons via the P-channel device or avalanche injection of holes via the N-channel device allows the storage of one of two distinct states. Furthermore, the stored state may be changed by subsequent electrical programming.

4 Claims, 4 Drawing Figures

FIELD PROGRAMMABLE READ-ONLY-MEMORY

BACKGROUND AND SUMMARY OF THE INVENTION

Previous electrically programmable ROM's have been programmed by causing a permanent and irreversible change in the memory metal interconnection pattern by electrical pulses. Some ROM's have been programmed by causing a reversible change in the characteristics of a memory device within the ROM. The so-called alterable ROM's were generally deprogrammed by exposing the unpackaged device to ultraviolet light or by exposing a sealed package containing the ROM to a dose of X-ray radiation.

One such alterable ROM is the FAMOS Read-Only-Memory such as that described in the IEEE Journal of Solid-State Circuits, Volume SC-6, No. 5, October, 1971, by Dov Frohman-Bentchkowsky. Commercial devices using this technology are the 1602A, 1702A and 1302 alterable ROM's manufactured by Intel. These devices contain a quartz lid which allows erasure, i.e., the returning of the internal devices to the unprogrammed state, through the use of high-intensity, ultraviolet light.

In accordance with the preferred embodiment of the present invention, an alterable ROM is provided which may be field-programmed by electrical pulses. The information stored therein is subsequently held for an indefinite period. However, in contrast to previous alterable ROM's, the memory cell of the preferred embodiment may be deprogrammed by subsequent electrical pulses. A P-channel mosfet and an N-channel mosfet are constructed on a single chip using a common floating gate. By using a common floating gate for the P and N-channel devices, it is possible to cause avalanche injection of either holes or electrons into the floating gate, thereby representing one of two distinct states. Furthermore, by subsequently reversing the programming voltages applied, it is possible to reprogram the memory cell and change the stored value. No additional power is required to maintain the memory cell between reprogramming. Furthermore, the cell can be interrogated through nondestructive methods which use voltages less than that required for programming.

DESCRIPTION OF THE PREFERRED EMBODIMENT

Figure 1:
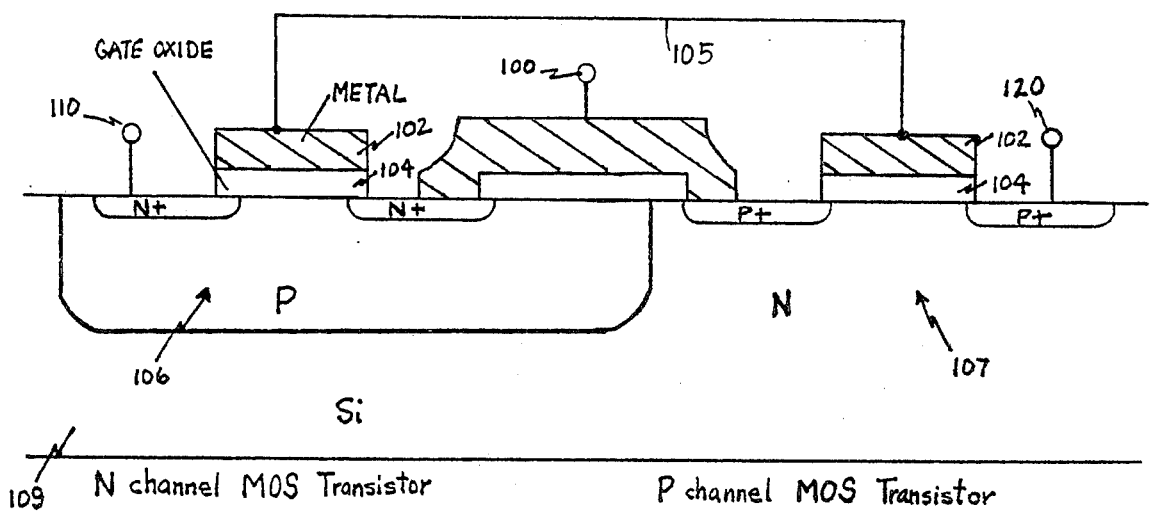
FIG. 1 shows the structure of a CMOS implementation of the preferred embodiment.

Referring now to FIG. 1, there is shown a cross-sectional view of a device constructed in accordance with the preferred embodiment using CMOS technology. A metallic gate 102 is isolated by an oxide layer 104 of approximately 800–1000 A thickness. The floating gates 102 are interconnected by an electrical path 105. An N-channel MOS transistor 106 and a P-channel MOS transistor 107 are constructed. The source of transistor 106 is connected to terminal 110. The drain of transistor 106 and the source of transistor 107 being connected to terminal 100. The drain of transistor 107 is connected to terminal 120.

Figure 2:
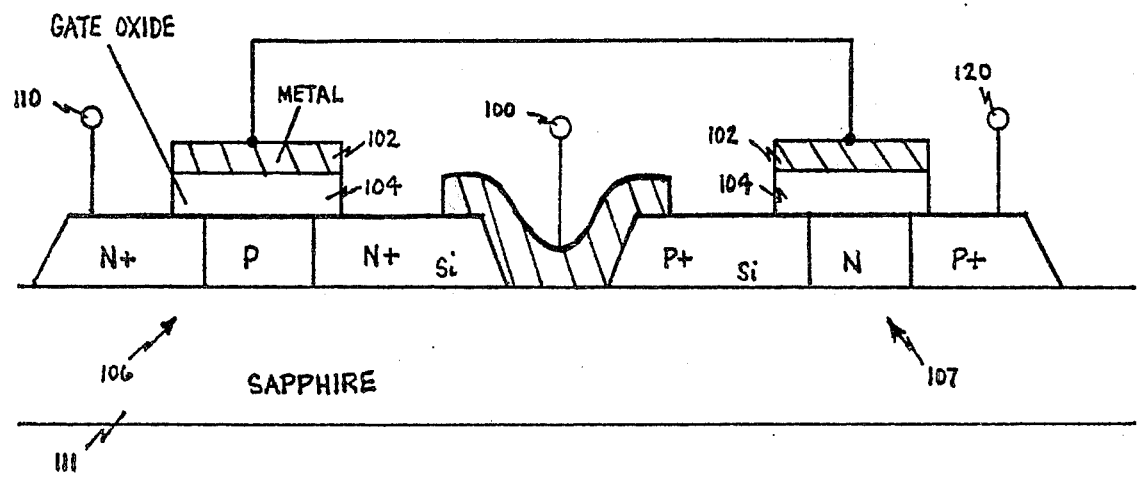
FIG. 2 shows the structure of the memory element of the preferred embodiment using an SOS/CMOS implementation.
Figure 3:
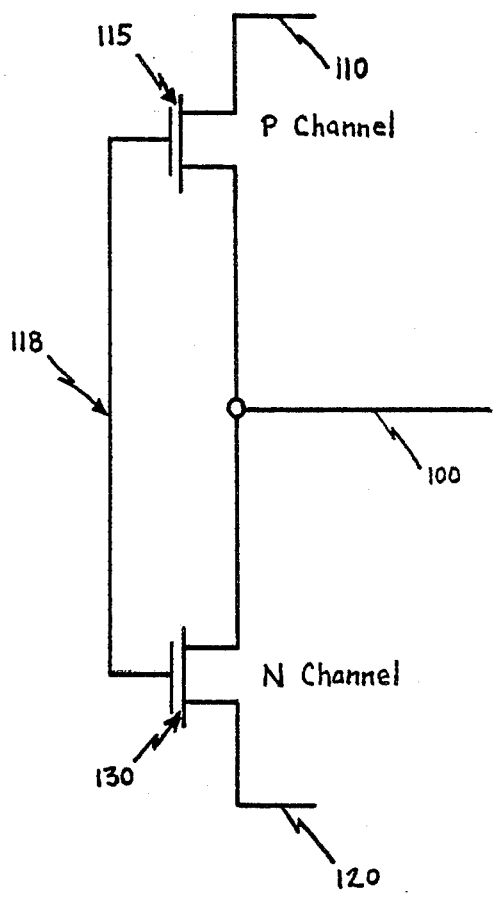
FIG. 3 is a schematic diagram of a single memory cell in accordance with the preferred embodiment.

In FIG. 2, there is shown an implementation of the preferred embodiment using silicon on sapphire (SOS) CMOS implementation. Using this technique, substrate 111 is a sapphire material.

Operation of the memory cell depends on charge transport to the floating gate by avalanche injection of electrons from either the source or the drain of the P-N junctions of P-channel MOS transistor 107 or the injection of holes from the P-N junction avalanche regions of N-channel MOS transistor 106.

If one desires to accumulate holes in the gate region 102, then a junction voltage sufficient to cause breakdown of the internal diode is applied across the N-channel device. This can be accomplished by holding terminal 110 at ground and placing a sufficiently large positive voltage on terminal 100 to cause avalanche across the P-N junctions of transistor 106. This will simultaneously cause the injection of holes onto gate 102. Alternatively, a sufficiently large negative voltage may be applied to terminal 100, holding terminal 120 at ground, to result in the injection of electrons from the P-N junction of transistor 107 onto gate 102. Of course, the amount of charge transferred to the gate 102 will depend on both the amplitude and the duration of the applied junction voltages.

Since the gate 102 is floating, that is, isolated by oxide layer 104, the accumulated charge on the gate will remain there after the removal of the programming voltage. The presence of the charge, however, may be sensed by the amount of conductance between the source and drain regions of transistors 106 and 107. Therefore, one could initially program the memory cell by causing the injection of electrons onto metal gate 102. By arbitrarily assigning the presence of electrons as a one and the absence of electrons as a zero, a binary representation of data is possible. Furthermore, since the gate is electrically isolated, the charge cannot be removed by the electrical pulses used to sense the presence of the charge.

In contrast to the prior art, however, the information can be altered by applying a programming voltage to cause holes to be deposited on gate electrode 102. Not only can this be used to deprogram or erase the stored data, but one might also use the memory cell in a Read-Write-Memory where the presence of electrons on the gate would be assigned a value of one and the presence of holes would be assigned the value of zero. A nondestructive read cycle could be accomplished using low voltages. However, when one desired to change the stored values, the higher programming voltages would be used.

Figure 4:
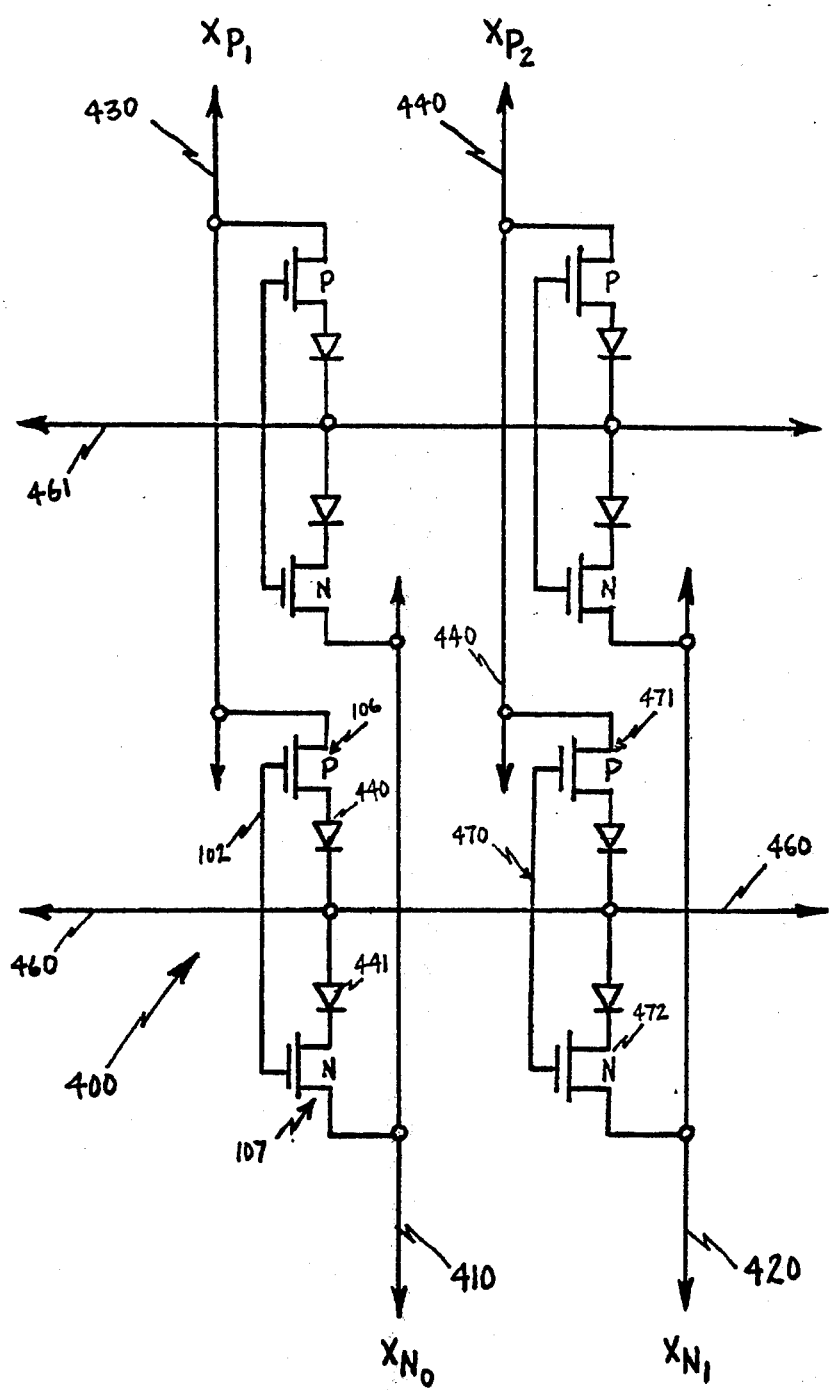
FIG. 4 shows a small segment of a memory system using the memory cell in accordance with the preferred embodiment.

Referring to FIG. 4, there is shown a 4-bit segment of a memory system in accordance with the preferred embodiment. To cause electrons to be stored on the floating gate 102, the Y-address lines such as 460 are used in conjunction with X-lines such as 430 which are connected to the P-channel MOS devices. To program holes on floating gate 102, X-address lines such as 410 are used with the Y-address lines such as 460. In the read mode, preselected voltages are applied to the selected X-lines. For example, a positive voltage may be applied to line 430 and ground to line 410. To determine the stored charge in memory cell 400, one would then sense a signal on line 460. If electrons are stored on gate 120, P-channel MOS transistor 106 will be conducting, and a positive voltage will be present on line 460. Alternatively, if holes are stored on floating gate 102, MOS transistor 107 will be conducting, and ground will be sensed on line 460. In this way, the cell can be determined to be in one of two clearly defined states.

To reprogram the status of cell 400, one would apply a sufficiently high positive voltage on line 430 and hold Y-address line 460 at a ground level, to store electrons on floating gate 102; or line 460 could be held in a ground potential, and a large negative voltage could be applied to line 410 to cause holes to be stored on floating gate 102. Of course, other combinations of voltages on the various lines could be used to cause the desired potential difference across MOS transistor 106 or MOS transistor 107.

Diodes such as 440 and 441 are not essential to the operation of the basic circuit, but are added to supply isolation when constructing an array to eliminate conductive paths which would interfere with the operation of the memory.

With the diodes in place, the memory array could be operated in the following manner: Electrons are written onto floating gate 470 by applying a negative voltage to lines 420 and 460 while line 440 is held at ground potential. Holes are written onto gate 470 by applying a positive voltage to lines 440 and 460 while holding line 420 at ground potential. Once the desired charge is stored on the floating gate, it may be nondestructively read by applying a positive voltage on line 440 and a ground potential to line 420 and sensing the signal produced on line 460. If electrons are stored on gate 470, the signal on line 460 will be a positive voltage, since the electrons will cause P-MOS transistor 471 to be conductive and N-channel transistor 472 to be nonconductive. If holes are stored on the floating gate, then N-MOS transistor 472 will be conductive, P-MOS transistor 471 will not be conductive, and therefore, line 460 will be held at essentially ground level.

I claim:

1. A memory circuit comprising:
    a first logic element having first and second terminals for providing a conductive path therebetween in response to a charge of a first polarity on a third terminal;
    a second logic element having first and second terminals for providing a conductive path therebetween in response to the presence of a charge of a second polarity on a third terminal thereof;
    said third terminals of said first and second logic elements being electrically coupled and further being electrically isolated from any other direct electrical contact; and
    said first logic element being further coupled to said second logic element through the electrical coupling of said second terminal of said first logic element to the first terminal of said second logic element.

2. A memory circuit comprising:
    a P-channel field-effect transistor having a source, a drain, and an electrically isolated gate; an N-channel field-effect transistor having a source, a drain, and an electrically isolated gate; said electrically isolated gate of said P-channel field-effect transistor being coupled to said electrically isolated gate of said N-channel field-effect transistor; no other direct electrical contact being made to said electrically isolated gates of said N-channel and P-channel field-effect transistors; said P-channel field-effect transistor being further coupled to the N-channel field-effect transistor by the electrical coupling of the drain of one to the source of the other.

3. A memory system comprising a plurality of the memory circuits as in claim 2 arranged in rows and columns and coupled by first address lines electrically coupling the circuits in the same row one to another at the point where the source of one is electrically coupled to the drain of another;
    second address lines coupling the source terminals which are not coupled to the other field-effect transistor in that memory circuit to the other unconnected source terminals along that column; and
    third address lines electrically coupling the unconnected drains of the field-effect transistors to the other unconnected drains of the field-effect transistors in their respective columns.

4. The memory system as in claim 3 wherein diodes are interposed between the electrically coupled sources and drains of said field-effect transistors and the first address line for eliminating undesired conductive paths between said first address line and said second and third address lines via said field-effect transistors when said devices are coupled together to form a memory array.

* * * * *

UNITED STATES PATENT AND TRADEMARK OFFICE
CERTIFICATE OF CORRECTION

PATENT NO. : 4,142,251
DATED : February 27, 1979
INVENTOR(S) : S. Stanley Mintz

It is certified that error appears in the above-identified patent and that said Letters Patent are hereby corrected as shown below:

Column 1, line 66, change "A" to -- Å --.

Signed and Sealed this

Eleventh Day of December 1979

[SEAL]

Attest:

SIDNEY A. DIAMOND

Attesting Officer     Commissioner of Patents and Trademarks